United States Patent
Yoo et al.

(10) Patent No.: US 7,901,586 B2
(45) Date of Patent: Mar. 8, 2011

(54) METHOD OF MANUFACTURING SELF-ORDERED NANOCHANNEL-ARRAY AND METHOD OF MANUFACTURING NANODOT USING THE NANOCHANNEL-ARRAY

(75) Inventors: In-kyeong Yoo, Gyeonggi-do (KR);
Soo-hwan Jeong, Gyeonnggi-do (KR);
Sun-ae Seo, Seoul (KR); In-sook Kim,
Gyeonggi-do (KR)

(73) Assignee: Samsung Electronics Co., Ltd.,
Suwon-Si, Gyeonggi-Do (KR)

( * ) Notice: Subject to any disclaimer, the term of this patent is extended or adjusted under 35 U.S.C. 154(b) by 846 days.

(21) Appl. No.: 11/882,112

(22) Filed: Jul. 30, 2007

(65) Prior Publication Data

US 2008/0257861 A1    Oct. 23, 2008

Related U.S. Application Data

(62) Division of application No. 10/819,143, filed on Apr. 7, 2004, now Pat. No. 7,282,446.

(30) Foreign Application Priority Data

Apr. 21, 2003   (KR) .................................. 2003-25082

(51) Int. Cl.
*B44C 1/22* (2006.01)
*H01L 21/302* (2006.01)
(52) U.S. Cl. ............... 216/11; 216/41; 216/58; 438/689; 438/706; 438/710; 438/719; 438/720; 264/41
(58) Field of Classification Search .................... 216/11, 216/41, 58; 438/689, 706, 710, 719, 720; 264/41
See application file for complete search history.

(56) References Cited

U.S. PATENT DOCUMENTS

| | | | |
|---|---|---|---|
| 6,139,713 | A | 10/2000 | Masuda et al. |
| 6,709,929 | B2 | 3/2004 | Zhang et al. |
| 6,914,259 | B2 | 7/2005 | Sakiyama et al. |
| 6,930,053 | B2 | 8/2005 | Mori et al. |

(Continued)

FOREIGN PATENT DOCUMENTS

DE    101 54 756 C1    11/2002

(Continued)

OTHER PUBLICATIONS

Office Action issued by Korean Patent Office on Dec. 10, 2009 in corresponding Korean Patent Application No. 050846693.

(Continued)

*Primary Examiner* — Shamim Ahmed
(74) *Attorney, Agent, or Firm* — Buchanan Ingersoll & Rooney PC

(57) ABSTRACT

A method of manufacturing a nanochannel-array and a method of fabricating a nanodot using the nanochannel-array are provided. The nanochannel-array manufacturing method includes: performing first anodizing to form a first alumina layer having a channel array formed by a plurality of cavities on an aluminum substrate; etching the first alumina layer to a predetermined depth and forming a plurality of concave portions on the aluminum substrate, wherein each concave portion corresponds to the bottom of each channel of the first alumina layer; and performing second anodizing to form a second alumina layer having an array of a plurality of channels corresponding to the plurality of concave portions on the aluminum substrate. The array manufacturing method makes it possible to obtain finely ordered cavities and form nanoscale dots using the cavities.

5 Claims, 6 Drawing Sheets

U.S. PATENT DOCUMENTS

| | | | |
|---|---|---|---|
| 2002/0191880 A1* | 12/2002 | Borrelli et al. | 385/11 |
| 2004/0163441 A1 | 8/2004 | Sawitowski | |
| 2005/0084611 A1* | 4/2005 | Okuyama et al. | 427/248.1 |

FOREIGN PATENT DOCUMENTS

| | | |
|---|---|---|
| JP | 61198245 | 9/1986 |
| JP | 10121292 | 5/1998 |
| JP | 2002004087 | 1/2002 |
| JP | 2002285382 | 10/2002 |
| JP | 2003307604 | 10/2003 |
| JP | 2003531962 A2 | 10/2003 |
| JP | 2004217961 | 8/2004 |
| JP | 62027829 | 2/2009 |
| WO | 2004/079056 A2 | 9/2004 |

OTHER PUBLICATIONS

Hideki Masuda et al., "Fabrication of Gold Nanodot Array Using Anodic Porous Alumina as an Evaporation Mask," Jpn. J. App. Phys., Jan. 15, 1996, pp. L126-L129, vol. 35, Part 2, No. 1B.

Hideki Masuda et al., "Fabrication of Ordered Arrays of Multiple Nanodots Using Anodic Porous Alumina as an Evaporation Mask," Advanced Materials, Jul. 19, 2000, pp. 1031-1033, vol. 12, No. 4, Wiley-VCH Verlag GmbH, Germany.

Soo-Hwan Jeong et al., "Preparation of Aligned Carbon Nanotubes with Prescribed Dimensions: Template Synthesis and Sonication Cutting Approach," 2002, pp. 1859-1862, vol. 14, No. 4, American Chemical Society.

European Search Report for EP 04 25 2172, dated Oct. 31, 2005.

Stephen Y. Chou et al., "Imprint of sub-25 nm vias and trenches in polymers," *Appl. Phys. Lett*, Nov. 20, 1995, pp. 3114-3116, vol. 67, No. 21, American Institute of Physics, Melville, N.Y., U.S.A.

Hideki Masuda et al., "Highly ordered nanochannel-array architecture in anodic alumina," *Appl. Phys. Lett.*, Nov. 10, 1997, pp. 2770-2772, vol. 71, No. 19, American Institute of Physics, Melville, N.Y., U.S.A.

Office Action issued by Japanese Patent Office in corresponding Japanese Application No. 2004-123814.

* cited by examiner

FIRST ANODIZING

SECOND ANODIZING

METHOD OF MANUFACTURING SELF-ORDERED NANOCHANNEL-ARRAY AND METHOD OF MANUFACTURING NANODOT USING THE NANOCHANNEL-ARRAY

This application claims the priority of Korean Patent Application No. 2003-25082, filed Apr. 21, 2003, the contents of which are incorporated herein by reference in their entirety and U.S. application Ser. No. 10/819,143, now U.S. Pat. No. 7,282,446, issued Oct. 16, 2007.

BACKGROUND OF THE INVENTION

1. Field of the Invention

The present invention relates to a method of manufacturing an array of vertical nanochannels and a method of manufacturing a nanodot using the array, and more particularly, to a method of forming a self-ordered nanochannel-array by two-step anodizing and a method of fabricating a nanodot using the nanochannel-array.

2. Description of the Related Art

Recently, researches have been actively conducted to form nano-scale patterns or structures in memories, laser diodes (LDs), photo diodes (PDs), transistors, far-infrared detectors, solar cells, optical modulators, and the likes. For example, a nanodot associated with an electronic control changes the number of bound electrons in correspondence to its size. Since electronic devices using nanodots can be actuated with a smaller number of electrons compared to conventional electronic devices, a threshold current level is lowered to enable low voltage actuation. The devices using nanodots also have the advantage of offering a high throughput with low voltage.

A conventional nanodot fabrication method utilizes a traditional deposition process including low pressure chemical vapor deposition (LPCVD) to form $Si/Si_3N_4$ nuclei or sprays nanoparticles onto a substrate. However, the conventional approach makes it difficult to control the sizes of nanoparticles. Furthermore, spraying nanoparticles of an equal size cannot guarantee uniform nanodot distribution.

Another conventional method is to use electron beam lithography or laser beam lithography. This approach not only makes it difficult to obtain a nanodot of the desired size due to process limitation but also suffers from restriction in reducing its size. Furthermore, it is well known that lithography is a complicated and expensive process.

Meanwhile, Stephen Y. Chou et al. have proposed a method of forming a metal nanodot on a silicon substrate. This method involves imprinting a PMMA layer formed on a silicon substrate with a mold, forming a channel array to a predetermined depth, removing the residual PMMA from the bottom of a channel and forming a metal layer on the resulting structure, and soaking the substrate in an etching solution and lifting off the PMMA layer and residual metal thereon (Appl. Phys. Lett., Vol. 67. No. 21. 20 Nov. 1995). According to this technique, the size or spacing of a nanodot is determined by the mold. That is, the nanodot size is limited by a microscale patterning of the mold such as photolithography. Thus, its size cannot be reduced to less than the limit allowed in a photolithography process.

Hideki Masuda et al. have proposed a method of manufacturing a nanochannel-array that can be usefully used for developing various nanoscale devices (Appl. Phys. Lett. 71(19), 10 Nov. 1997). This method involves performing compression molding on a shallow-concavity, carrying out an anodizing process, and forming a self-ordered channel-array. However, this method has a problem in that the size of each channel or array is limited by the mold.

SUMMARY OF THE INVENTION

The present invention provides a method for easily forming a smaller and highly ordered nanochannel-array using a self-alignment technique.

The present invention also provides a method of manufacturing a nanodot using the highly ordered nanochannel-array, which is designed to allow a simplified and faster process and low manufacturing cost.

According to an aspect of the present invention, there is provided a method of manufacturing a self-ordered nanochannel array which includes the steps of: performing first anodizing an aluminum substrate to form a first alumina layer having a channel array formed by a plurality of cavitie; etching away the first alumina layer to form a plurality of concave portions on the aluminum substrate, wherein each concave portion corresponds to the bottom of each channel of the first alumina layer; and performing second anodizing to form a second alumina layer having an array of a plurality of channels corresponding to the plurality of concave portions on the aluminum substrate.

According to another aspect of the present invention, there is provided a method of manufacturing a nanodot, including the steps of: performing a first anodizing to form a first alumina layer having an array of a plurality of channels on a template containing an aluminum layer; etching the first alumina layer to a predetermined depth and forming a plurality of concave portions, each of which corresponds to the bottom of each channel of the first alumina layer, on the aluminum layer; performing second anodizing to form a second alumina layer having an array of a plurality of channels corresponding to the plurality of concave portions on the aluminum layer; forming a mask layer that covers a processing object layer on a substrate where the processing object layer has been formed; performing compression molding on the mask layer using the second alumina layer in the template and transferring the profile of the channel array in the second alumina layer to the mask layer; and etching the mask layer and the underlying processing object layer and transferring the compression molded profile of the mask layer to the processing object layer.

In the nanodot manufacturing method, the mask layer may be made from photoresist or polymethylmethyacrylate (PMMA). The processing object layer may be made from silicon.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, a method of manufacturing a self-ordered nanochannel-array and a method of manufacturing a nanodot using the nanochannel-array as a template according to preferred embodiments of this invention will be described with reference to the accompanying drawings.

First, a method of manufacturing a nanochannel-array on an aluminum substrate will be described.

The nanochannel-array manufacturing method according to this exemplary embodiment of the invention includes a two-step anodizing process.

Figure 1A:
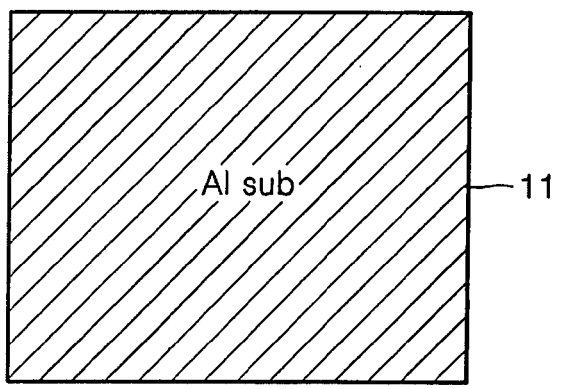
FIGS. 1A-1E show steps of a method of manufacturing a self-ordered nanochannel-array using two-step anodizing according to exemplary embodiments of the present invention.

As shown in FIG. 1A, an aluminum substrate 11 is prepared. Here, the aluminum substrate 11 may be constructed from a pure aluminum plate or a structure in which an aluminum layer has been formed on a separate supporting substrate.

Figure 1B:
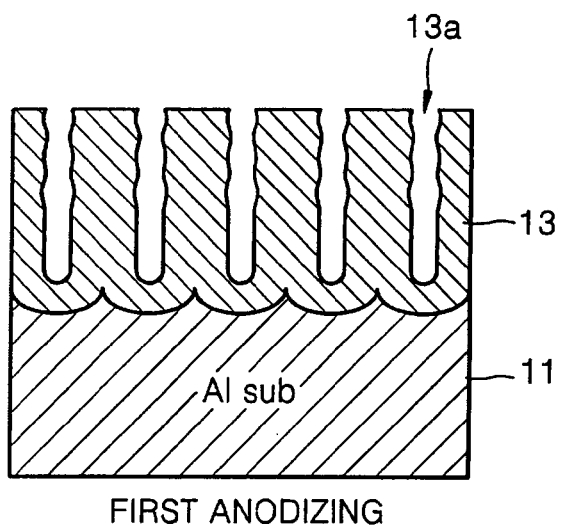

Referring to FIG. 1B, the aluminum substrate 11 is oxidized to a predetermined depth by first anodizing to form a porous alumina layer 13. During the extending of the alumina layer 13 from the surface of the original aluminum surface 11 by the first anodizing, the first anodizing, the vertical shape of a channel 13a is irregularly distorted due to nonuniformity in morphology of the aluminum substrate 11 that begins to be oxidized.

Figure 1C:
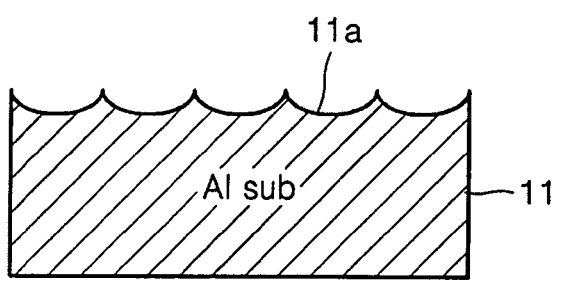

In FIG. 1C, the alumina layer 13 is cleaned off with an etching solution. In this case, equally nano-sized concave portions 11a remain to form an array on the aluminum substrate 11 that has been exposed after etching.

Figure 1D:
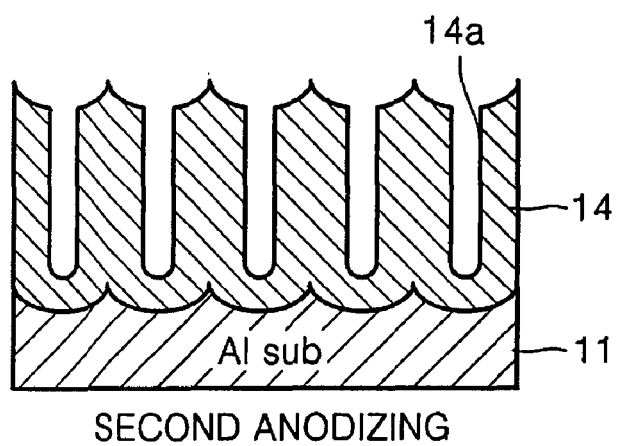

Referring to FIG. 1D, second anodizing is performed under the same condition as was given for the first anodizing to form a porous alumina layer 14 having a plurality of channels 14a to a predetermined depth.

Figure 1E:
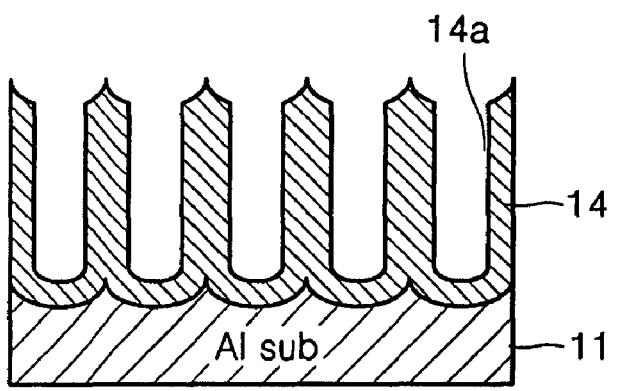

As shown in FIG. 1E, the channel 14a is widened by appropriately adjusting the temperature and concentration of a solution and a value of an applied voltage only when necessary.

Figure 2:
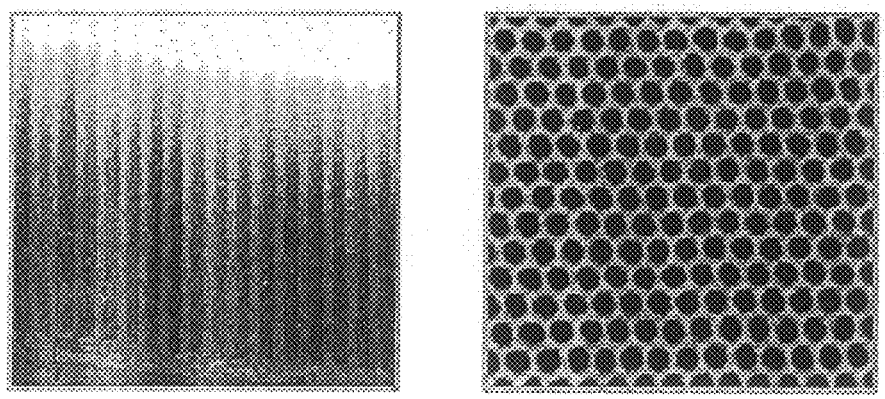
FIG. 2 shows a cross-section (left) and a top view (right) showing a nano-hole array of a nanochannel-array manufactured according to an embodiment of this invention.

FIG. 2 shows a cross-section (left) of the nanochannel-array formed by the two-step anodizing process, a top view (right) of the nanochannel-array presenting an arrangement of the nanochannels.

The nanochannel-array described above can be used as a template in a method of forming a nanodot according to this invention.

Figure 3A:
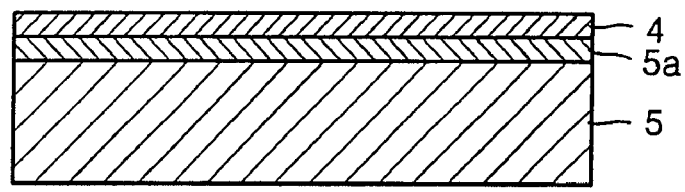
FIGS. 3A-3H show steps of a method of manufacturing a nanodot using the nanochannel-array of FIG. 2 as a template according to an embodiment of this invention.

Referring to FIG. 3A, a substrate 5 on which a processing object layer 4 on which crystalline or amorphous silicon have been formed is prepared. Here, the substrate 5 may be a silicon substrate, and silicon oxide 5a is sandwiched between the processing object layer 4 and silicon substrate 5. Since the silicon oxide is only an example of material that can reside beneath the processing object layer 4, a material other than silicon oxide may be used. Furthermore, the processing object layer 4 may be constructed of a material other than silicon. That is, a nanodot manufacturing method according to this invention is not limited by the material forming the processing object layer 4, and a method of adopting this material provides another embodiment of this invention.

Figure 3B:
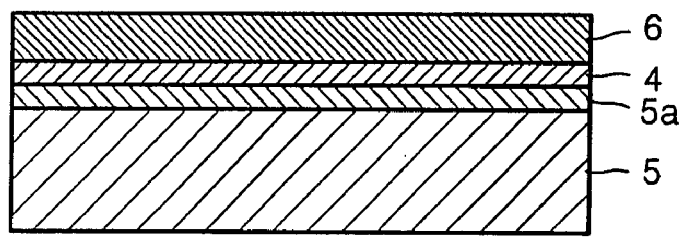

Referring to FIG. 3B, a mask layer 6 made of photoresist or polymethylmethyacrylate (PMMA) is formed on the processing object layer 4 to a predetermined thickness. Here, the thickness of the mask layer 6 is set considering compressing molding.

Figure 3C:
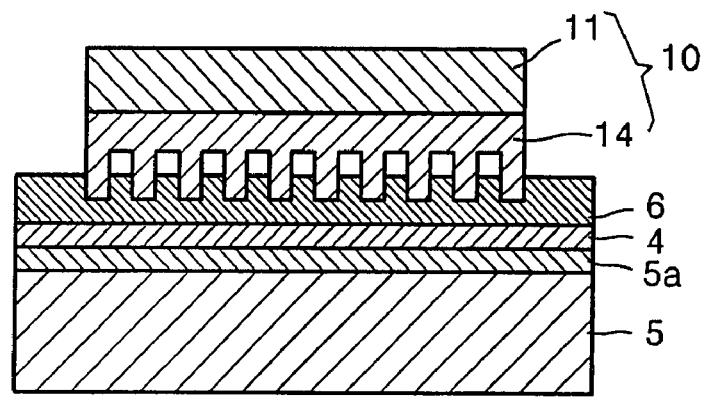

As shown in FIG. 3C, compression molding is performed on the mask layer 6 using a template 10 where the alumina layer 14 having an array of a plurality of channels has been formed on the aluminum substrate 11. At that time, the alumina layer 14 faces the mask layer 6 so that the profile of the channel array in the alumina layer 14 can be transferred to the mask layer 6.

Figure 3D:
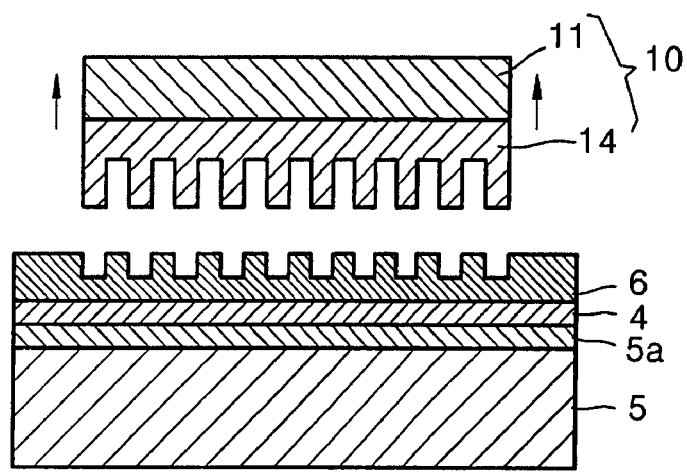
Figure 3E:
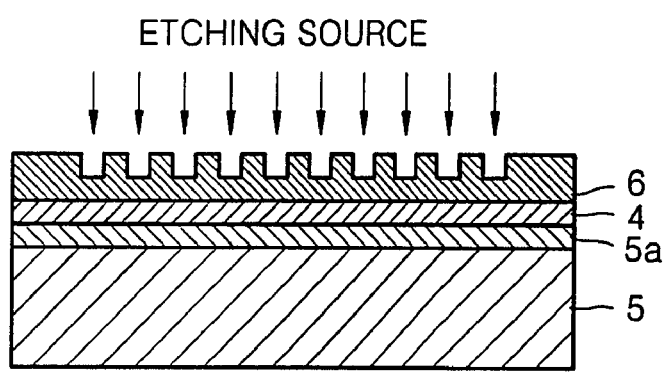
Figure 3F:
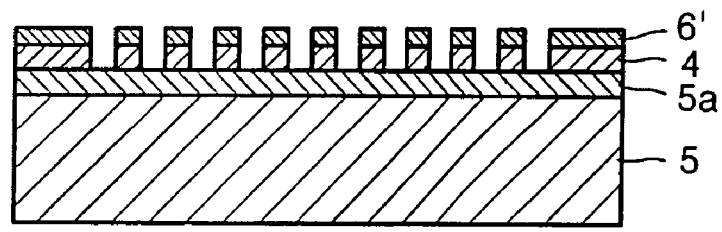
Figure 3G:
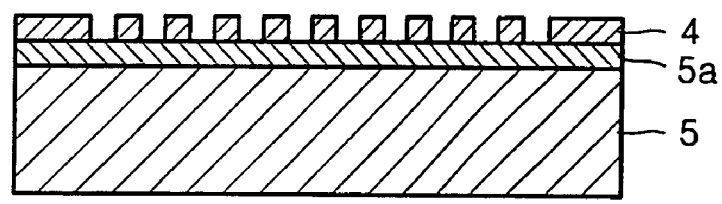

In FIG. 3D, the template 10 is separated from the mask layer 6, and as shown in FIG. 3G, etching is performed on the entire surface of the mask layer 6. In this case, RIE or ion milling is performed to etch the mask layer 6 by a uniform thickness. Sufficient etching proceeds under these conditions so that the template profile transferred to the mask layer 6 can be transferred to the processing object layer 4. After the transfer process, the processing object layer 4 remains in the form of nanodots.

If residue 6' of the mask layer 6 remains as shown in FIG. 3E after having processed the processing object layer 4 in the form of nanodots, the residue 6' is removed as shown in FIG. 3F. This step can be skipped to the next one if no residue remains.

Figure 3H:
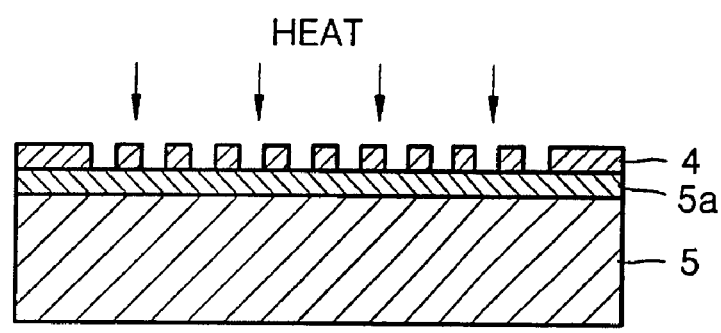

As shown in FIG. 3H, if the processing object layer 4 is made of amorphous silicon, the processing object layer 4 is annealed by applying heat. The annealing process is carried out as needed and in particular when making amorphous silicon into crystalline silicon.

The above steps for forming nanodots with the processing object layer 4 have been generally described herein. That is, the steps are only a part of the process of manufacturing an electric device so this invention is not limited by a method of fabricating a specific electric device.

The nanochannel-array fabricating method according to this invention involves forming self-ordered concave portions by first anodizing and etching and then self-ordered channels by second anodizing. This invention allows a channel-array obtained in this way to be used as a template in place of a mold formed by lithography, thus eliminating the need to perform an expensive lithography process while providing a faster process that can be applied to a large area. Furthermore, this invention makes it possible to easily adjust channel spacing and size of a nanochannel-array through an anodizing process and then the size and spacing of a nanodot array fabricated using the nanochannel-array.

The channel-array manufacturing method and a method of fabricating nanodots using the channel-array according to this invention can be applied to the manufacturing of various types of electronic devices including memories, laser diodes (LDs), photo diodes (PDs), transistors, far-infrared detectors, solar cells, and optical modulators.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a nanodot based on a self-ordered nanochannel-array, the method comprising:

performing first anodizing on an aluminum substrate to form a first alumina layer having a channel array formed by a plurality of cavities;

etching away the first alumina layer to form a plurality of concave portions on the aluminum substrate, wherein each concave portion corresponds to the bottom of each channel of the first alumina layer;

performing second anodizing on the aluminum substrate to form a second alumina layer having an array of a plurality of channels corresponding to the plurality of concave portions on the aluminum substrate;

forming a mask layer on a processing object layer, wherein the processing object layer is formed on another substrate;

transferring a profile of the channel array of the second alumina layer to the mask layer through compression molding; and etching the mask layer so that the profile is transferred to the processing object layer.

2. The method of claim 1, wherein the second anodizing is performed under the same conditions as the first anodizing.

3. The method of claim 1, wherein the masklayer is made from photoresist or polymethylmethyacrylate (PMMA).

4. The method of claim 1, wherein the processing object layer is made from silicon.

5. The method of claim 2, wherein the processing object layer is made from silicon.

\* \* \* \* \*